(12) United States Patent
Specht et al.

(10) Patent No.: US 7,700,427 B2
(45) Date of Patent: Apr. 20, 2010

(54) INTEGRATED CIRCUIT HAVING A FIN STRUCTURE

(75) Inventors: Michael Specht, Munich (DE); Franz Hofmann, Munich (DE); Wolfgang Roesner, Ottobrunn (DE); Guerkan Ilicali, Munich (DE)

(73) Assignee: Qimonda AG, Munich (DE)

( * ) Notice: Subject to any disclaimer, the term of this patent is extended or adjusted under 35 U.S.C. 154(b) by 107 days.

(21) Appl. No.: 11/762,582

(22) Filed: Jun. 13, 2007

(65) Prior Publication Data
US 2008/0308856 A1 Dec. 18, 2008

(51) Int. Cl.
*H01L 21/8238* (2006.01)
(52) U.S. Cl. .......................... 438/201; 438/211; 438/257; 257/E21.179; 257/E21.422
(58) Field of Classification Search .................. 257/314, 257/315, 316, 317, 321, 324, E29.129, E29.3, 257/E21.179, E21.422, E21.68; 438/201, 438/211, 257, 266, 593
See application file for complete search history.

(56) References Cited

U.S. PATENT DOCUMENTS

| | | |
|---|---|---|
| 2005/0199913 A1 | 9/2005 | Hofmann et al. |
| 2005/0242388 A1* | 11/2005 | Willer et al. ................. 257/314 |
| 2005/0242391 A1 | 11/2005 | She et al. |
| 2006/0071259 A1 | 4/2006 | Verhoeven |
| 2006/0237777 A1 | 10/2006 | Choi et al. |
| 2007/0001173 A1 | 1/2007 | Brask et al. |

FOREIGN PATENT DOCUMENTS

| | | |
|---|---|---|
| DE | 102 41 171 A1 | 3/2004 |
| DE | 10 2004 050 929 A1 | 4/2006 |

OTHER PUBLICATIONS

Specht, M., et al., "20 nm tri-gate SONOS memory cells with multi-level operation," IEEE International, IEDM Technical Digest, Electron Devices Meeting, Dec. 2004, pp. 1083-1085.
Oh, C.W., et al., "Damascene Gate FinFET SONOS Memory Implemented on Bulk Silicon Wafer," IEEE International, IEDM Technical Digest, Electron Devices Meeting, Dec. 2004, pp. 893-896.

* cited by examiner

*Primary Examiner*—Hoai v Pham

(57) ABSTRACT

Embodiments of the invention relate generally to a method for manufacturing an integrated circuit, a method for manufacturing a cell arrangement, an integrated circuit, a cell arrangement, and a memory module. In an embodiment of the invention, a method for manufacturing an integrated circuit having a cell arrangement is provided, including forming at least one semiconductor fin structure having an area for a plurality of fin field effect transistors, wherein the area of each fin field effect transistor includes a first region having a first fin structure width, a second region having a second fin structure width, wherein the second fin structure width is smaller than the first fin structure width. Furthermore, a plurality of charge storage regions are formed on or above the second regions of the semiconductor fin structure.

18 Claims, 12 Drawing Sheets

INTEGRATED CIRCUIT HAVING A FIN STRUCTURE

TECHNICAL FIELD

Embodiments of the invention relate generally to a method for manufacturing an integrated circuit, a method for manufacturing a cell arrangement, an integrated circuit, a cell arrangement, and a memory module.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

As used herein the terms "connected" and "coupled" are intended to include both direct and indirect connection and coupling, respectively.

Embodiments of the invention relate generally to a method for manufacturing an integrated circuit, a method for manufacturing a cell arrangement, a method for manufacturing a cell, an integrated circuit, a cell arrangement, a cell, and a memory module.

A memory cell arrangement having a plurality of fin field effect transistors (also referred to as FinFETs) as basic memory cells being coupled in accordance with a NAND coupling structure are suitable for data storage at high density. Such a NAND memory cell arrangement has one effect in that the memory cells of a so-called memory cell string comprising a plurality of serially source-to-drain coupled memory cells can be contacted using only a small number of contacts (e.g., two contacts for a memory string having 32 memory cells, for example). Thus, a $4F^2$-grid can almost be achieved.

However, beginning with a minimum feature size of about 30 nm (F=30 nm), a very demanding thickness of the fin of less than 15 nm is required for the lithography processes. A fin of such a thickness may be manufactured in a sub-lithographic manner using one or more of the following processes such as, e.g., a so-called photoresist trimming, so-called "sacrificial" oxidations, spacer lithography processes.

The small thickness and the variation of the thicknesses of the fins will however lead to significant serial resistances and will therefore deteriorate the reading time and indirectly also the programming time due to read verify cycles.

Furthermore, a sufficient mechanical stability of a fin having a thickness of less than 15 nm and a length in the range of about 1 µm to about 2 µm during a conventional process is questionable.

In an embodiment of the invention, a memory cell arrangement is provided having a plurality of fin field effect transistors (also referred to as FinFETs), which are coupled with each other in accordance to a logic function. In an embodiment of the invention, the plurality of fin field effect transistors are coupled with each other in accordance with a NAND coupling, e.g., serially source-to-drain coupled, wherein a fin structure may have at least one fin field effect transistor string having a plurality of fin field effect transistors. The plurality of fin field effect transistors may be one-transistor memory cells, e.g., non-volatile memory cells or volatile memory cells. The logic fin field effect transistors may be used in any kind of processor such as, e.g., in a microprocessor or in an ASIC or in another type of programmable or hard-wired processor. Furthermore, in an embodiment of the invention, the memory cells formed by the fin field effect transistors may be single-bit memory cells and/or multi-bit memory cells. In an alternative embodiment of the invention, the memory cells formed by the fin field effect transistors may be single-level memory cells and/or multi-level memory cells.

Although the described embodiments refer to a NAND structure, any other type of coupling the fin field effect transistors with each other may be provided in an alternative embodiment of the invention.

As used herein the term "multi-bit" memory cell is intended to, e.g., include memory cells which are configured to store a plurality of bits by spatially separated electric charge storage regions or current conductivity regions, thereby representing a plurality of logic states.

As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In the context of this description, a "volatile memory cell" may be understood as a memory cell storing data, the data being refreshed during a power supply voltage of the memory system being active, in other words, in a state of the memory system, in which it is provided with power supply voltage.

A "non-volatile memory cell" may be understood as a memory cell storing data even if it is not active. In an embodiment of the invention, a memory cell may be understood as being not active, e.g., if currently access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months.

An embodiment of the invention provides a process, in which the fin structures are locally thinned in the region, in which the word lines are formed, for example. In this way, the mechanical stability within the manufacturing process is increased (see, e.g., FIGS. 8A-8B). Furthermore, in an embodiment of the invention, a low sub-threshold leakage current may be provided.

Figure 3:
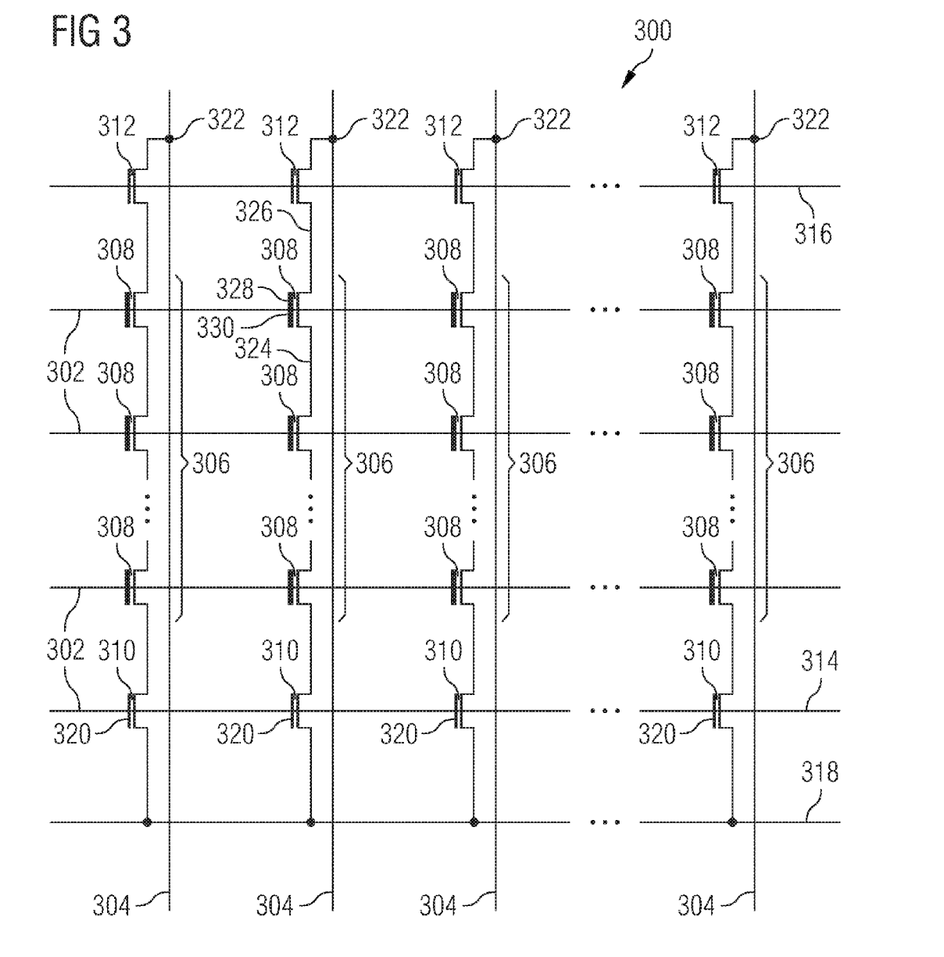
FIG. 3 shows a cell arrangement in accordance with an embodiment of the invention.

FIG. 3 shows a cell arrangement 300 in accordance with an embodiment of the invention.

In one embodiment of the invention, the cell arrangement 300 is a NAND memory cell array 300 as part of a memory device (in general, as part of an electronic device including the cell arrangement 300). The NAND memory cell array 300 includes word lines 302 (in general, an arbitrary number of word lines 302, in one embodiment of the invention, 1024 word lines 302) and crossing bit lines 304 (in general, an arbitrary number of bit lines 304, in one embodiment of the invention, 512 bit lines 304).

The NAND memory cell array 300 includes NAND strings 306, each NAND string 306 having charge trapping memory cells 308 (e.g., charge trapping transistor-type memory cells as will be described in more detail below). Furthermore, an arbitrary number of charge trapping memory cells 308 can be provided in the NAND string 306, in accordance with one embodiment of the invention, 32 charge trapping memory cells 308. The charge trapping memory cells 308 are connected in series source-to-drain between a source select gate 310, which may be implemented as a field effect transistor, and a drain select gate 312, which may also be implemented as a field effect transistor. Each source select gate 310 is positioned at a crossover of a bit line 304 and a source select line 314. Each drain select gate 312 is positioned at a crossover of a bit line 304 and a drain select line 316. The drain of each source select gate 310 is connected to the source terminal of the first charge trapping memory cells 308 of the corresponding NAND string 306. The source of each source select gate 310 is connected to a common source line 318. A control gate 320 of each source select gate 310 is connected to the source select line 314.

In one embodiment of the invention, the common source line 318 is connected between source select gates 310 for NAND strings 306 of two different NAND arrays. Thus, the two NAND arrays share the common source line 318.

In an embodiment of the invention, the drain of each drain select gate 312 is connected to the bit line 304 of the corresponding NAND string 306 at a drain contact 322. The source of each drain select gate 312 is connected to the drain of the last charge trapping memory cell 308 of the corresponding NAND string 306. In one embodiment of the invention, at least two NAND strings 306 share the same drain contact 322.

In accordance with the described embodiments, each charge trapping memory cell 308 includes a source 324 (e.g., a first source/drain region), a drain 326 (e.g., a second source/drain region), a charge storage region 328 (e.g., a dielectric layer stack) and a control gate 330 (e.g., a gate region). The control gate 330 of each charge trapping memory cell 308 is connected to a respective word line 302. A column of the NAND memory cell array 300 includes a respective NAND string 306 and a row of the NAND memory cell array 300 includes those charge trapping memory cells 308 that are commonly connected to a respective word line 302.

In an alternative embodiment of the invention, the cell arrangement 300 is a NOR memory cell array 300. In yet another embodiment of the invention, the cell arrangement 300 may be arranged in accordance with any other suitable architecture.

Figure 4:
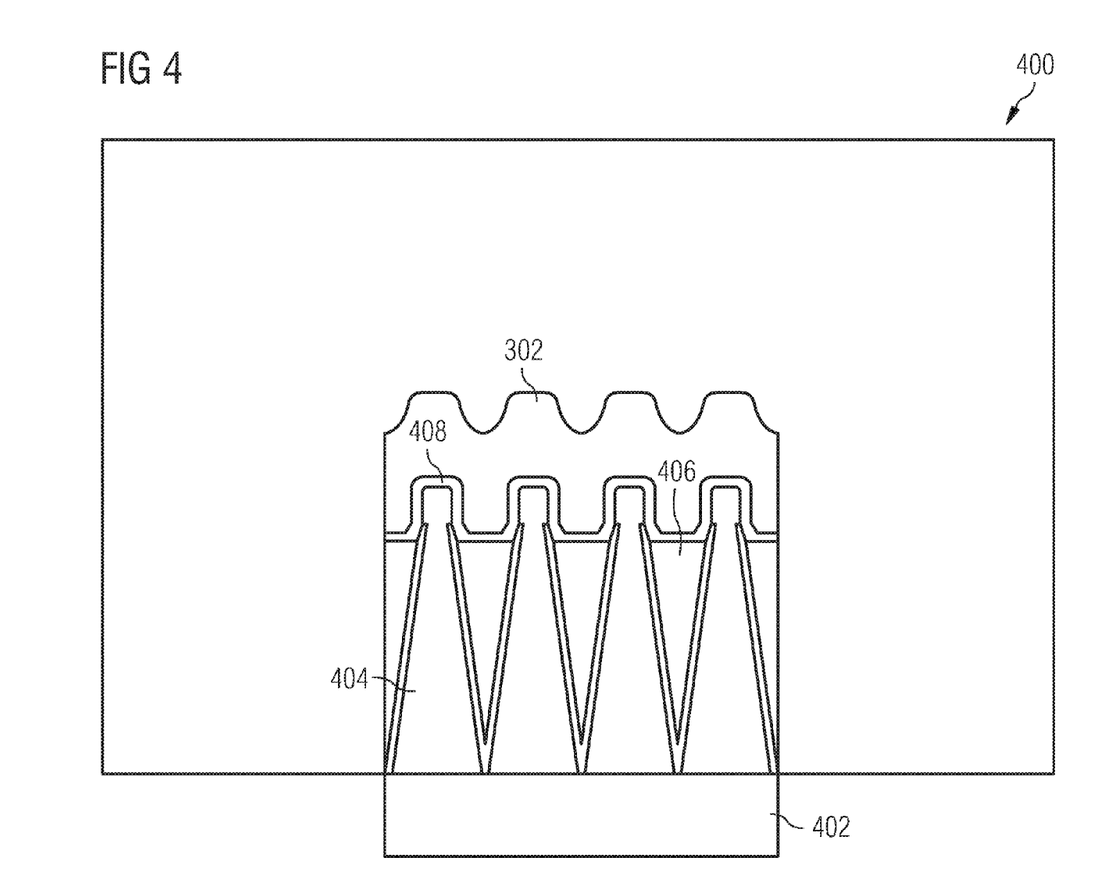
FIG. 4 shows a cross sectional view of a cell arrangement in accordance with an embodiment of the invention.

FIG. 4 shows a cross sectional view 400 of a cell arrangement in accordance with an embodiment of the invention.

The cross section is through a word line 302. As shown in FIG. 4, the cell arrangement 300 is formed on a carrier 402, e.g., a substrate. In an embodiment of the invention, the substrate (e.g., a wafer substrate) 402 may be made of semiconductor materials of various types, including silicon, germanium, Group III to V or other types, including polymers, for example, although in another embodiment of the invention, other suitable materials can also be used. In an exemplary embodiment of the invention, the substrate 402 is made of silicon (doped or undoped), in an alternative embodiment of the invention, the substrate 402 is a silicon on insulator (SOI) wafer. As an alternative, any other suitable semiconductor materials can be used for the substrate 402, for example, semiconductor compound material such as gallium arsenide (GaAs), indium phosphide (InP), but also any suitable ternary semiconductor compound material or quaternary semiconductor compound material such as indium gallium arsenide (InGaAs).

In an embodiment of the invention, a plurality of semiconductor fin structures 404 are provided, which may be made of silicon, for example. Each semiconductor fin structure 404 forms a respective NAND string 306 as described with reference to FIG. 3. The semiconductor fin structures 404 are isolated from each other by means of shallow trench isolation (STI) structures 406. In an embodiment of the invention, a charge storage region 408 is formed on or above the semiconductor fin structures 404. In an embodiment of the invention, the charge storage region 408 is a layer stack of a plurality of layers.

In an embodiment of the invention, the charge storage region 408 is a floating gate layer structure.

In another embodiment of the invention, the charge storage region 408 is a charge trapping layer structure. In an embodiment of the invention, the charge trapping layer structure includes a dielectric layer stack including at least two dielectric layers being formed above one another, wherein charge carriers can be trapped in at least one of the at least two dielectric layers. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an embodiment of the invention, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment of the invention, the charge trapping layer structure includes two, four or even more dielectric layers being formed above one another.

Furthermore, the word line 302 is provided as an electrically conductive structure on or above the charge storage region 408. The word line 302 also includes the gate regions of the respective memory cell transistors, e.g., the charge trapping memory cells 308.

Figure 1:
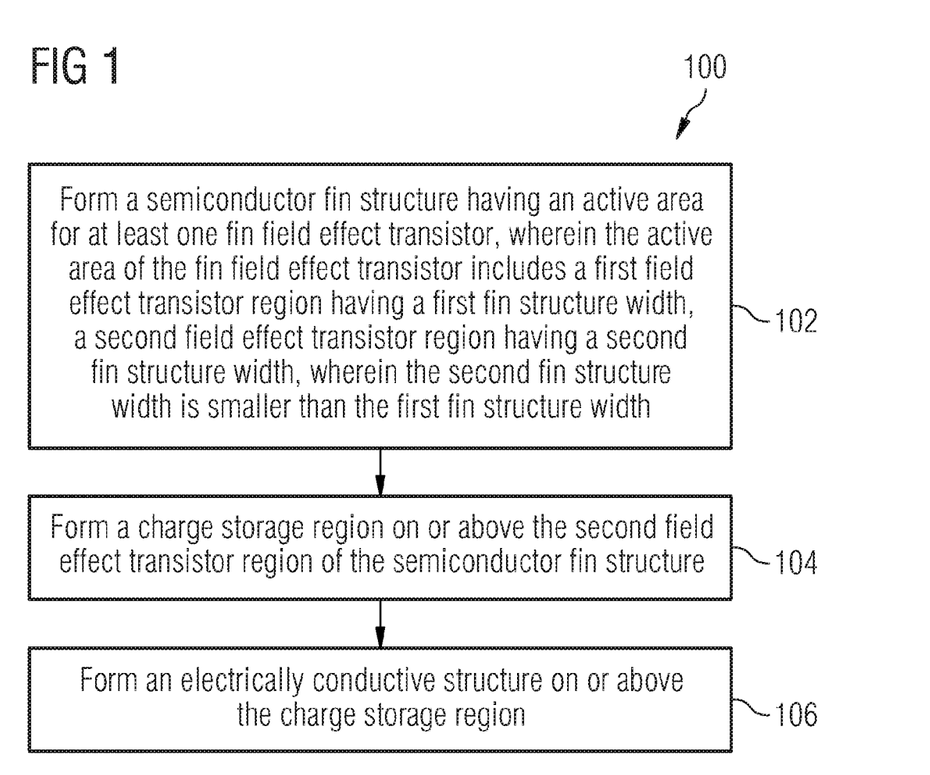
FIG. 1 shows a flow diagram illustrating a method for manufacturing a cell in accordance with an embodiment of the invention.

Referring now to FIG. 1, a method 100 for manufacturing a cell in accordance with an embodiment of the invention will be described in more detail.

At 102, a semiconductor fin structure is formed having an area, e.g., an active area, for at least one fin field effect transistor. As will be described in more detail below, the area of the fin field effect transistor includes a first region, e.g., a first field effect transistor region, having a first fin structure width and a second region, e.g., a second fin field effect transistor region, having a second fin structure width. The second fin structure width is smaller than the first fin structure width, in other words, the second region is thinned (e.g., locally thinned) in the longitudinal direction of the semiconductor fin structure compared with the first region. In an embodiment of the invention, the second region has an extension in longitudinal direction of the semiconductor fin structure that equals roughly the physical thickness of the dielectric charge trapping stack of the fin field effect transistor. In an embodiment of the invention, the second region has a length in the longitudinal direction of the semiconductor fin structure that is equal to the gate length of the cell, e.g., of the fin field effect transistor. In an embodiment of the invention, the semiconductor fin structure is formed by decreasing the width of the insulating layer in a lithographic or etching or trimming or oxidation based manner. Thus, the word line has more space and thus, larger gate lengths can be obtained.

At 104, a charge storage region is formed on or above the second region of the semiconductor fin structure (e.g., deposited, e.g., by means of a chemical vapour deposition (CVD) process or by means of a physical vapour deposition (PVD) process).

At 106, optionally, an electrically conductive structure (e.g., including the gate region of the fin field effect transistor) is formed on or above the charge storage region (e.g., deposited, e.g., by means of a CVD process or by means of a PVD process).

Figure 2:
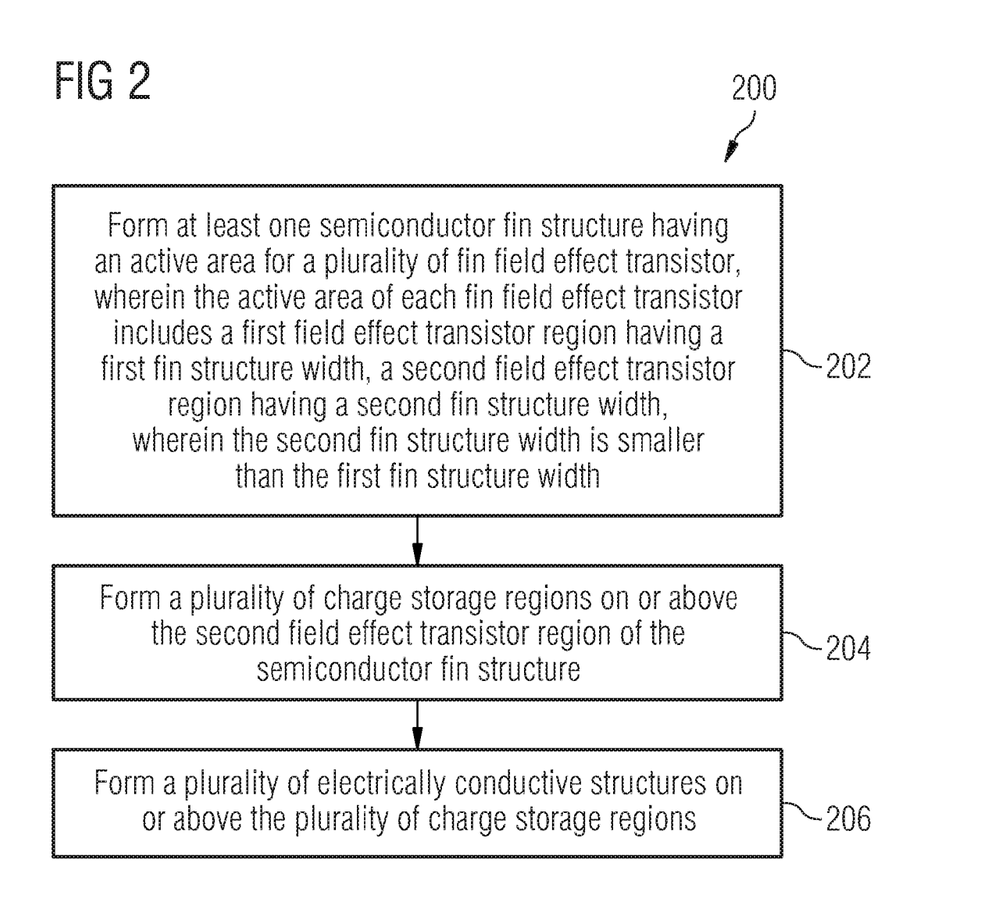
FIG. 2 shows a flow diagram illustrating a method for manufacturing a cell arrangement in accordance with an embodiment of the invention.

Referring now to FIG. 2, a method 200 for manufacturing a cell arrangement (in an alternative embodiment of the invention, a method for manufacturing an integrated circuit having a cell arrangement) in accordance with an embodiment of the invention will be described in more detail.

At 202, at least one semiconductor fin structure is formed having an area, e.g., an active area, for a plurality of fin field effect transistors. The area of each fin field effect transistor includes a first region, e.g., a first field effect transistor region, having a first fin structure width and a second region, e.g., a second fin field effect transistor region, having a second fin structure width. The second fin structure width is smaller than the first fin structure width, in other words, the second region is thinned (e.g., locally thinned) in the longitudinal direction of the semiconductor fin structure compared with the first region. In an embodiment of the invention, the second region has an extension in longitudinal direction of the semiconductor fin structure that equals the gate length of the fin field effect transistor.

At 204, a plurality of charge storage regions is formed on or above the second regions of the semiconductor fin structure (e.g., deposited, e.g., by means of a CVD or ALCVD process or by means of a PVD process or by thermal oxidation) (it should be mentioned, that this embodiment differs from the embodiment shown in FIG. 1 in that a plurality of charge storage regions is formed on or above the second regions of the semiconductor fin structure, wherein in the embodiment shown in FIG. 1, one charge storage region is formed on or above the second region of the semiconductor fin structure).

At 206, optionally, a plurality of electrically conductive structures is formed on or above the plurality of charge storage regions (e.g., deposited, e.g., by means of a CVD process or by means of a PVD process) (it should be mentioned, that this embodiment differs from the embodiment shown in FIG. 1 in that a plurality of electrically conductive structures is formed on or above the second fin field effect transistor regions of the semiconductor fin structure, wherein in the embodiment shown in FIG. 1, one electrically conductive structure is formed on or above the charge storage region).

In an embodiment of the invention, an additional semiconductor fin structure may be formed next to the semiconductor fin structure, wherein the semiconductor fin structure and the additional semiconductor fin structure extend substantially parallel to one another. In general, an arbitrary number of semiconductor fin structures (e.g., tens, hundreds, thousands or millions) may be formed next to one another. In the embodiment shown in FIGS. 3 and 4, four semiconductor fin structures are shown, wherein each semiconductor fin structure forms a respective NAND string 306.

In an embodiment of the invention, the semiconductor fin structure and the additional semiconductor fin structure may be formed by forming a semiconductor fin and an additional semiconductor fin next to one another, wherein the semiconductor fin and the additional semiconductor fin extend substantially parallel to one another and wherein a hollow space is formed between the semiconductor fin and the additional semiconductor fin. Furthermore, filling material may be formed into the hollow space (e.g., deposited, e.g., by means of a CVD process or by means of a PVD process). In an embodiment of the invention, an oxide may be used for the filling material, e.g., a silicon oxide, e.g., tetraethyl orthosilicate (TEOS).

Furthermore, as will be described in more detail below, an insulating layer is formed on the upper surface of the semiconductor fin and the additional semiconductor fin and the filling material, e.g., a nitride, e.g., silicon nitride ($Si_3N_4$). Then, the insulating layer may be patterned such that the upper surface of the semiconductor fin and the additional semiconductor fin is exposed in the second fin field effect transistor regions.

In an embodiment of the invention, the semiconductor fin and the additional semiconductor fin may be thinned in the second fin field effect transistor regions. Thus, in an embodiment of the invention, the semiconductor fin and the additional semiconductor fin are locally thinned in those regions, in which the gate region and the word lines will be formed.

In an embodiment of the invention, the thinning of the semiconductor fin structure and the additional semiconductor fin structure is carried out selectively with regard to the insulating layer, e.g., by means of etching (e.g., selective etching), e.g., by means of wet etching.

As will be described in more detail below, in an embodiment of the invention, the plurality of electrically conductive structures may be formed using a damascene process, in an embodiment of the invention, a self-adjusted damascene process.

Next, the remaining portions (after the patterning) of the insulating layer are removed, thereby exposing sidewalls of the electrically conductive structures and the fin.

Furthermore, an ion implantation process (e.g., using boron ions (B ions) or using arsene ions (As ions)) is carried out, thereby implanting doping atoms in the exposed portions of the semiconductor fin and the additional semiconductor fin, thereby forming source/drain regions in the semiconductor fin structure and the additional semiconductor fin structure.

In an embodiment of the invention, insulating spacers are formed on the exposed sidewalls of the electrically conductive structures.

Figures 5A, 5B:
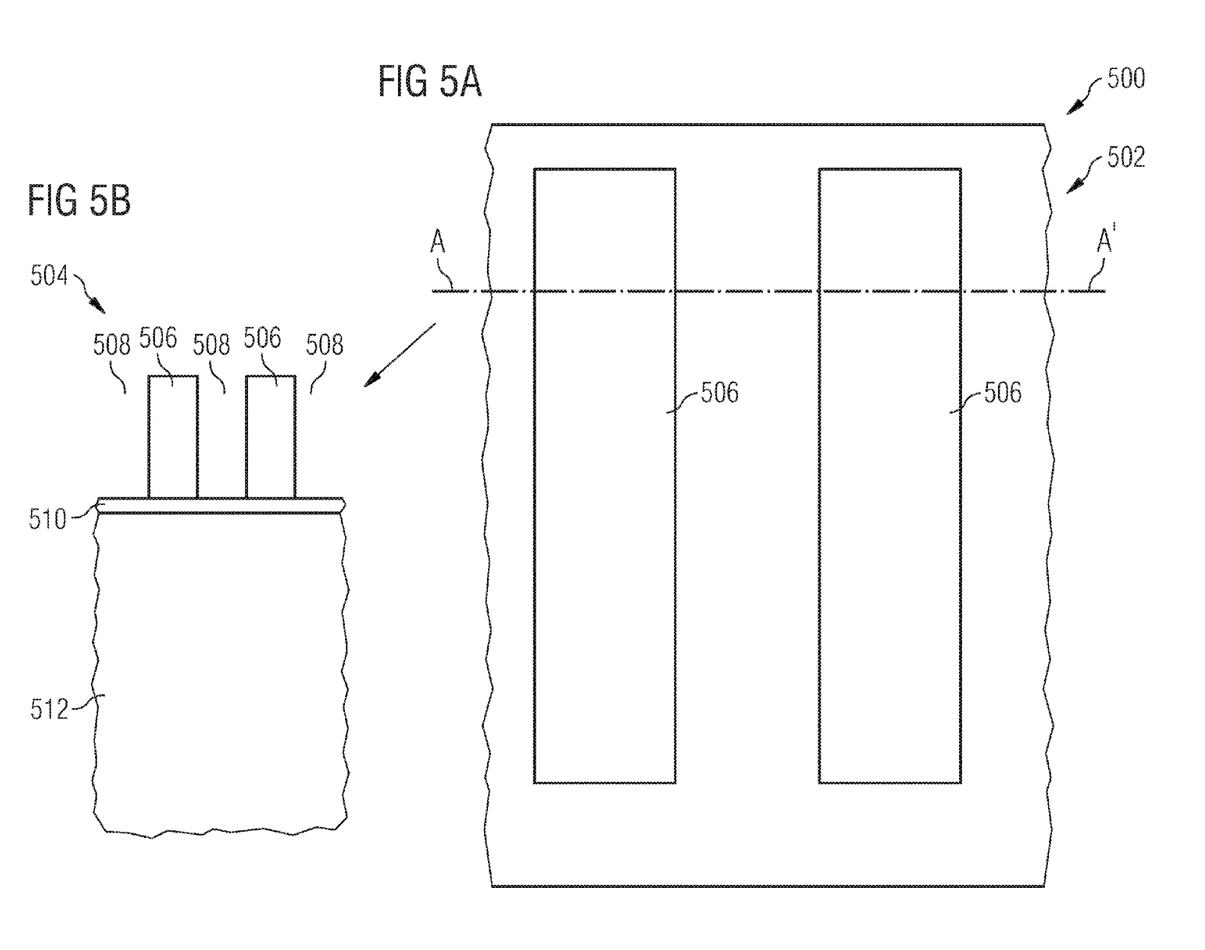
FIGS. 5A and 5B show a top view (FIG. 5A) and a cross sectional view (FIG. 5B) along a first section line A-A' of FIG. 5A of a cell arrangement in accordance with an embodiment of the invention at a first stage of its manufacture.

FIGS. 5A and 5B show a top view 502 (FIG. 5A) and a cross sectional view 504 (FIG. 5B) along a first section line A-A' of FIG. 5A of a cell arrangement 500 in accordance with an embodiment of the invention at a first stage of its manufacture.

Starting from an SOI wafer (e.g. having a silicon substrate 512, a silicon oxide layer 510 ($SiO_2$ layer) on the silicon substrate 512 and a thin silicon layer on the silicon oxide layer 510), for example, using a lithographic process and an etch process (e.g., a wet etch process, e.g., using KOH as an etchant), fins 506 are formed in the thin silicon layer. As shown in FIG. 5B, hollow spaces, e.g., in the form of trenches 508, are formed between the fins 506.

It should be mentioned that for a better understanding of the description, only two fins 506 are shown in the FIGS. 5A and 5B, although an arbitrary number of fins may be provided in the cell arrangement 500.

Figure 6A:
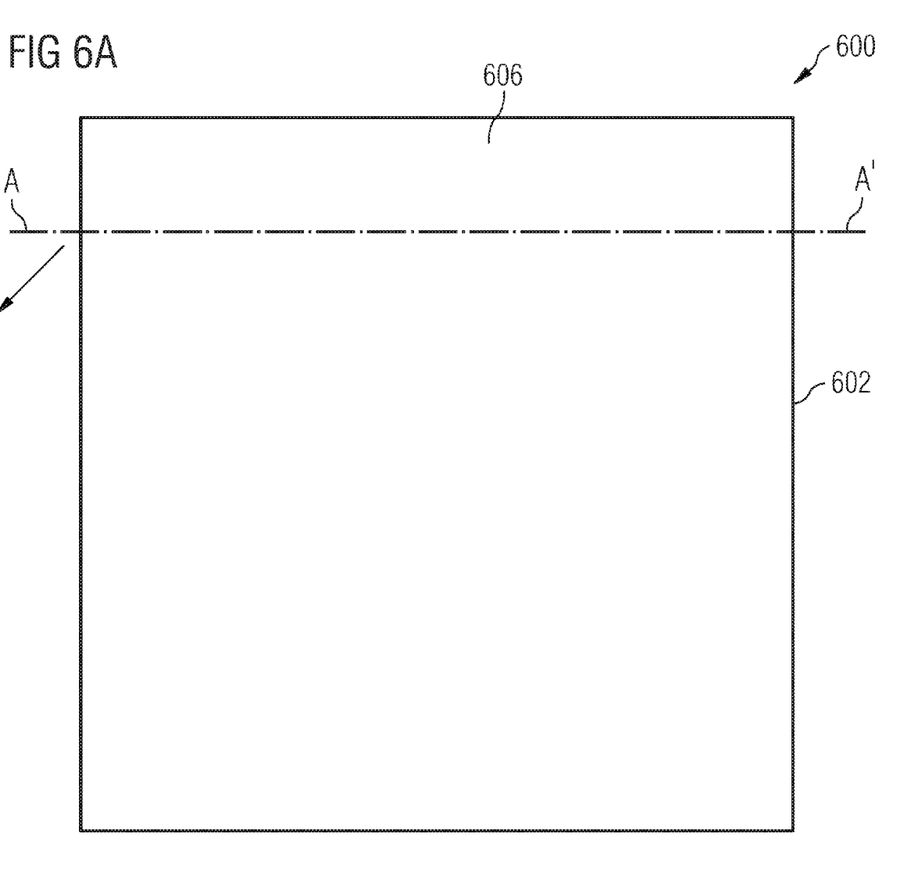
FIGS. 6A and 6B show a top view (FIG. 6A) and a cross sectional view (FIG. 6B) along a first section line A-A' of FIG. 6A of a cell arrangement in accordance with an embodiment of the invention at a second stage of its manufacture.
Figure 6B:
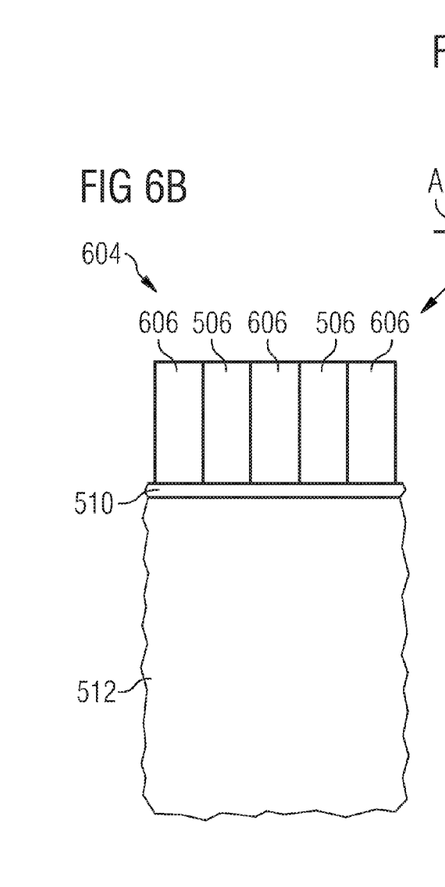

FIGS. 6A and 6B show a top view 602 (FIG. 6A) and a cross sectional view 604 (FIG. 6B) along a first section line A-A' of FIG. 6A of a cell arrangement 600 in accordance with an embodiment of the invention at a second stage of its manufacture;

Then, in an embodiment of the invention, an oxide, e.g., a tetraethyl orthosilicate (TEOS), e.g., a high density plasma (HDP) oxide, e.g., a HDP TEOS is deposited (e.g., using a CVD process), thereby filling and possibly overfilling the trenches 508. In an alternative embodiment of the invention, any front-end of line (FEOL) compatible insulating material may be used for filling the hollow spaces, e.g., the trenches 508. In an embodiment of the invention, a low-k dielectric material may be used, e.g., SiLK or a porous glass. The trench overfilling material is then removed, e.g., by means of a planarization process, e.g., by means of a chemical mechanical polishing (CMP) process, thereby exposing the upper surface of the fins 506 and forming shallow trench isolations (STI) 606. It should be mentioned that FIG. 6A shows the cell arrangement 600 before carrying out the CMP process.

Figure 7A:
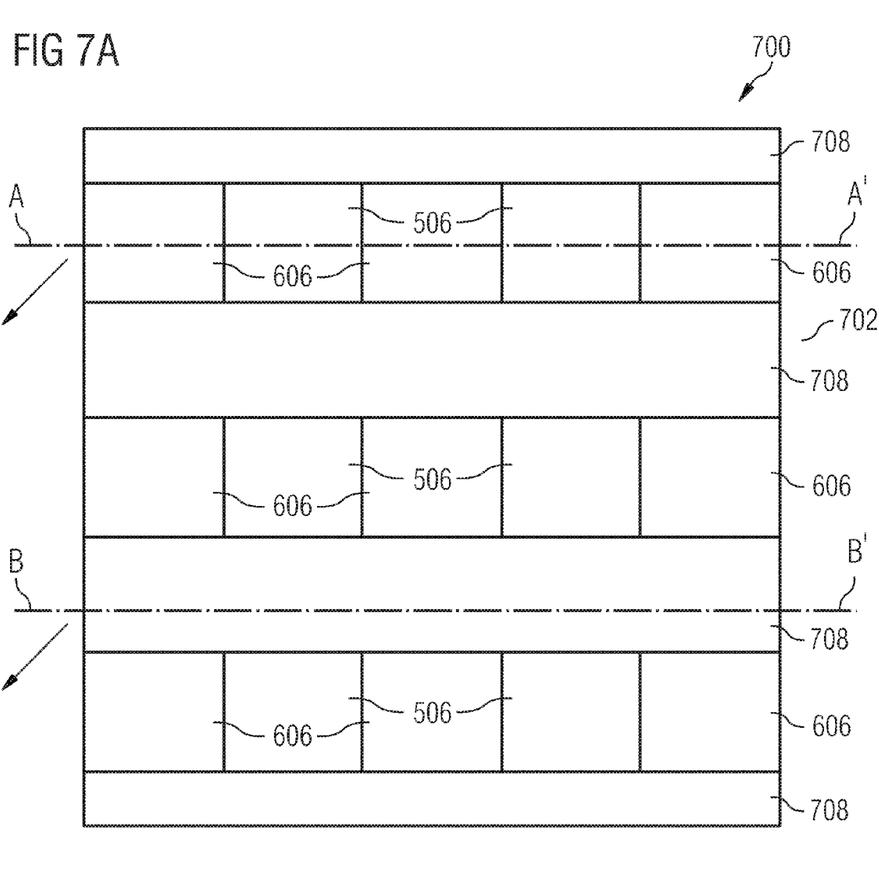
FIGS. 7A to 7C show a top view (FIG. 7A), a cross sectional view (FIG. 7B) along a first section line A-A' of FIG. 7A, and a cross sectional view (FIG. 7C) along a second section line B-B' of FIG. 7A of a cell arrangement in accordance with an embodiment of the invention at a third stage of its manufacture.
Figure 7B:
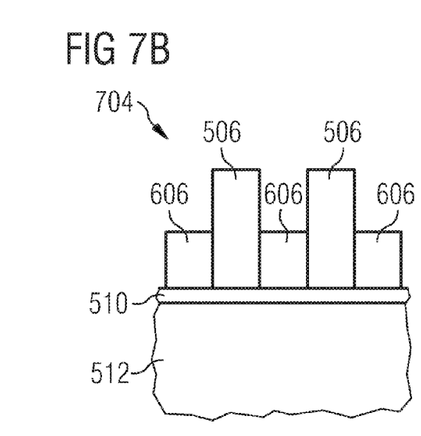
Figure 7C:
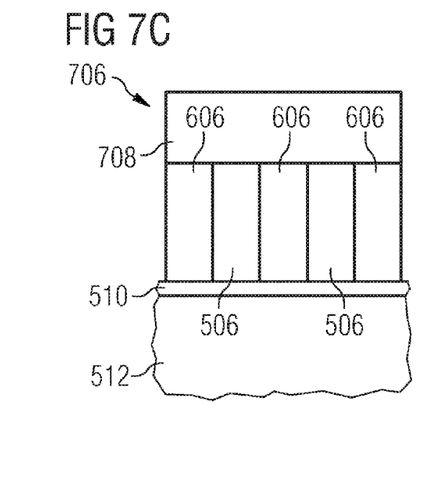

FIGS. 7A to 7C show a top view 702 (FIG. 7A), a cross sectional view 704 (FIG. 7B) along a first section line A-A' of FIG. 7A, and a cross sectional view 706 (FIG. 7C) along a second section line B-B' of FIG. 7A of a cell arrangement 700 in accordance with an embodiment of the invention at a third stage of its manufacture.

In a following process, nitride (e.g., silicon nitride) is deposited (e.g., by means of a CVD process or a PVD process) on the upper surface of the cell arrangement 600 shown in FIGS. 6A and 6B. Then, using a line mask, for example, in a lithography process and an etch process, stripe-shaped nitride portions 708 are formed above regions of the cell arrangement and in particular the fins 506, in which the source drain regions of the fin field effect transistors are to be formed later on. By etching the portions of the nitride between the remaining stripe-shaped nitride portions 708, portions of the fins 506 and the oxide between the fins 506 are exposed. In an embodiment of the invention, those regions of the fins 506 are exposed, in which the charge storage regions and the word lines 302 will be formed, as will be described in more detail below. In an embodiment of the invention, those regions of the fins 506 are exposed, in which the channels of the field effect transistors are formed in response to the application of suitable voltages to the word lines 302 and the source/drain regions (e.g., via the bit lines 304).

Then, the oxide of the exposed regions of the oxide is partially removed, e.g., using a dry etching process, e.g., using a selective dry etching process, which is sufficiently selective to the material of the fins 506, so that when removing the oxide, no or almost no material of the fins 506 is removed. In an embodiment of the invention, about 30% to about 70% of the oxide is removed, e.g., about 40% to about 60%, e.g., about 45% to about 55%, e.g., about 50%.

Figure 8A:
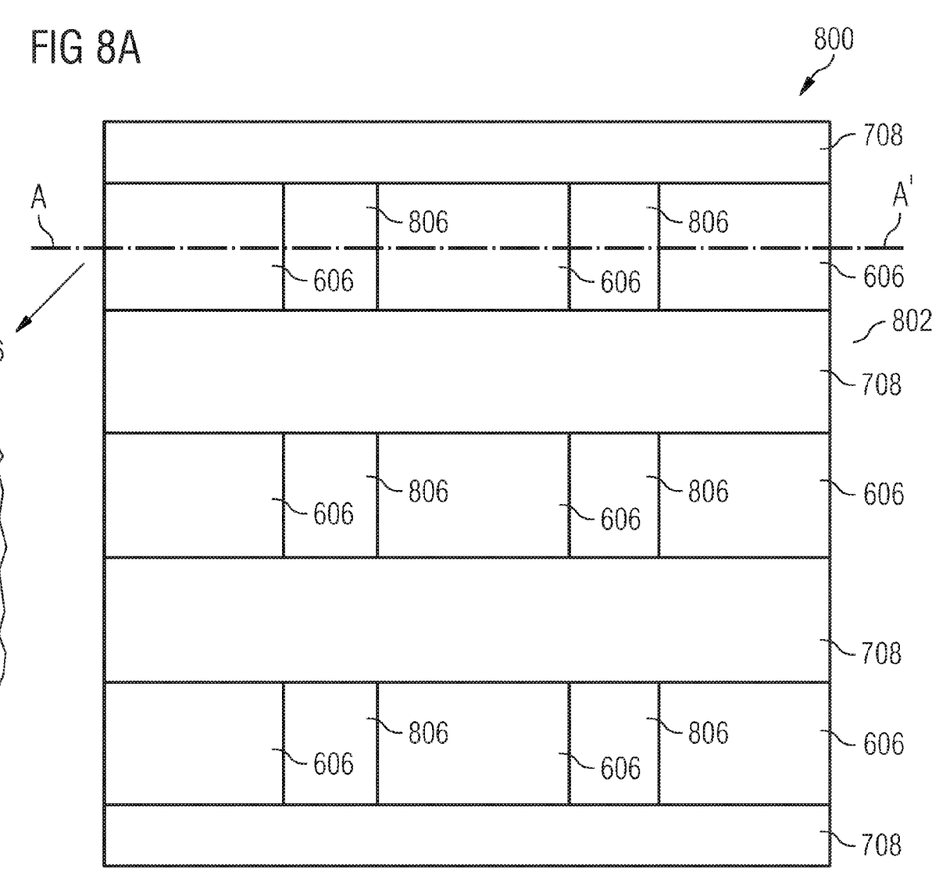
FIGS. 8A and 8B show a top view (FIG. 8A) and a cross sectional view (FIG. 8B) along a first section line A-A' of FIG. 8A of a cell arrangement in accordance with an embodiment of the invention at a fourth stage of its manufacture.
Figure 8B:
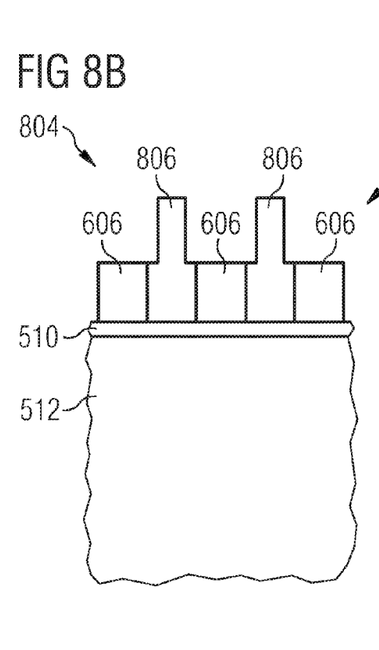

FIGS. 8A and 8B show a top view 802 (FIG. 8A) and a cross sectional view 804 (FIG. 8B) along a first section line A-A' of FIG. 8A of a cell arrangement 800 in accordance with an embodiment of the invention at a fourth stage of its manufacture.

Then, the exposed regions of the fins 506 are locally thinned (e.g., only in the region of the word lines 302 to be formed), thereby forming thinned regions 806 of the fins 506. Those portions of the fins 506, which are still covered by the stripe-shaped nitride portions 708 are not thinned. The thinning can be carried out using any suitable process.

In an embodiment of the invention, the thinning is carried out using one of the following processes:
 a so-called photoresist trimming,
 a so-called "sacrificial" oxidation,
 spacer lithography processes,
 etching.

In an embodiment of the invention, the thinning is carried out using selective etching (selective with regard to the oxide), e.g., using a KOH etching process (e.g., using tetramethyl ammonium hydroxide (TMAH) or choline). Illustratively, the thinning process can be understood as being a post-thinning of the fins 506 in the desired local regions. By doing this, each of the thinned regions of the fins 506 is mechanically well anchored, e.g., by the adjacent thicker regions of the fins 506 (which are not thinned) having a fin width of F (minimum feature size). Additionally, the series resistances are reduced in this way as compared to the case wherein the thinning occurs throughout the entire length of the fin.

Since, in an embodiment of the invention, the etching rate for etching the fin material, e.g., silicon, is dependent from the crystal orientation of the fin material crystal (which may be single-crystalline), this is taken into account during the design of the cell arrangement. In an embodiment of the invention, the material of the fin is oriented in <100> direction or in <110> direction in accordance with the Miller indices.

Figure 9A:
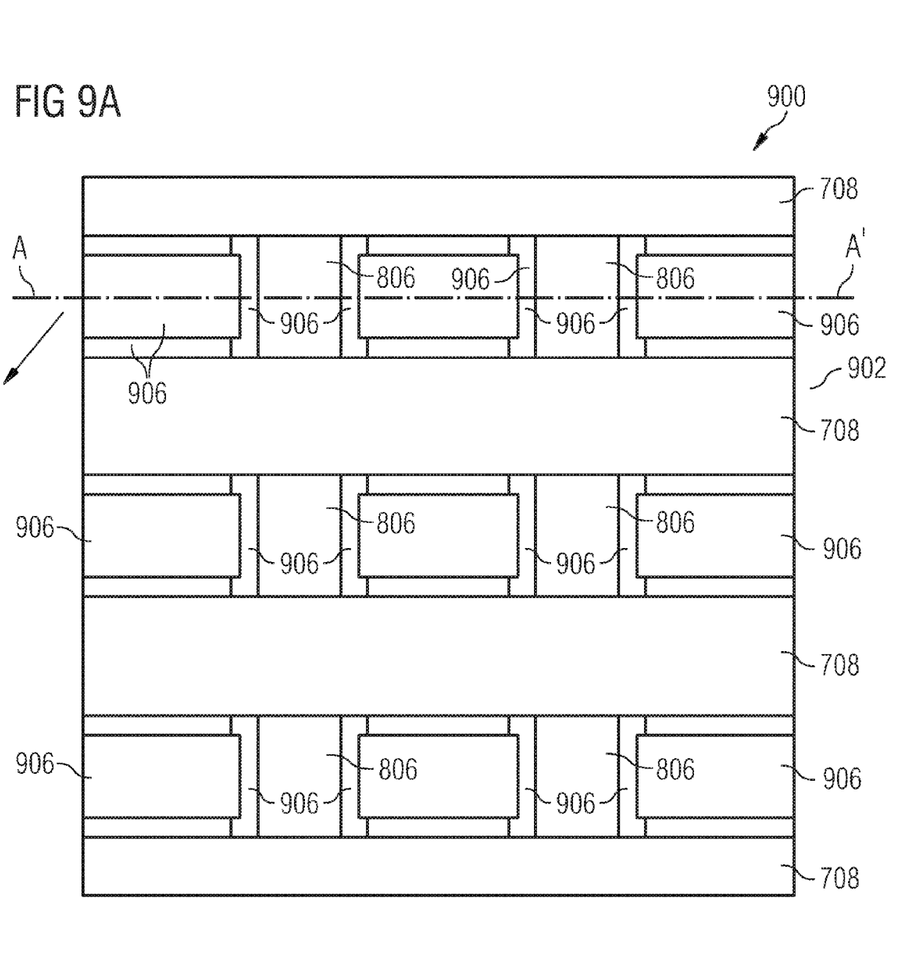
FIGS. 9A and 9B show a top view (FIG. 9A) and a cross sectional view (FIG. 9B) along a first section line A-A' of FIG. 9A of a cell arrangement in accordance with an embodiment of the invention at a fifth stage of its manufacture.
Figure 9B:
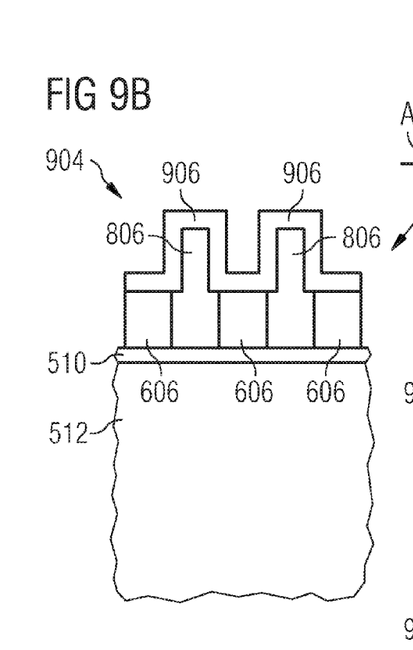

FIGS. 9A and 9B show a top view 902 (FIG. 9A) and a cross sectional view 904 (FIG. 9B) along a first section line A-A' of FIG. 9A of a cell arrangement 900 in accordance with an embodiment of the invention at a fifth stage of its manufacture.

Next, a charge storage layer stack 906, e.g., a charge trapping layer stack 906, is formed on the exposed regions of the STI 606 and the exposed sidewalls and the exposed surfaces of the thinned portions 806 of the fins 506. In an embodiment of the invention, an oxide-nitride-oxide (ONO) layer stack is formed as the charge trapping layer stack 906. In an embodiment of the invention, the ONO layer stack is formed as follows:

A first dielectric layer is formed (e.g., deposited, e.g., thermally grown or using a CVD process or a PVD process) on the exposed regions of the STI 606 and the exposed sidewalls and the exposed surfaces of the thinned portions 806 of the fins 506. The first dielectric layer thickness may be in the range of about 1.5 nm to about 7 nm, e.g., in the range of about 2 nm to about 6 nm, e.g. in the range of about 3 nm to about 5 nm, e.g., in the range of about 3.5 nm to about 4.5 nm, e.g., about 4 nm. In an embodiment of the invention, the first dielectric layer is an oxide, e.g., silicon oxide, although other suitable materials such as materials with higher dielectric constant than $SiO_2$ or combinations of them may be used in an alternative embodiment of the invention.

Then, a charge trapping layer as described above is deposited on the first dielectric layer. The charge trapping layer thickness may be in the range of about 3 nm to about 7 nm, e.g., in the range of about 4 nm to about 6 nm, e.g., about 5 nm.

Next, a second dielectric layer is deposited on the charge trapping layer. In a specific embodiment, the second dielectric layer is composed of an oxide such as, e.g., silicon oxide ($SiO_2$) or aluminum oxide ($Al_2O_3$). Any other suitable dielectric material, in particular any other suitable oxide may be used as the material of the second dielectric layer. The second dielectric layer thickness may be in the range of about 5 nm to about 15 nm, e.g., in the range of about 7 nm to about 13 nm, e.g., in the range of about 8 nm to about 12 nm, e.g., in the range of about 9 nm to about 11 nm, e.g., about 10 nm.

Figures 10A, 10B:
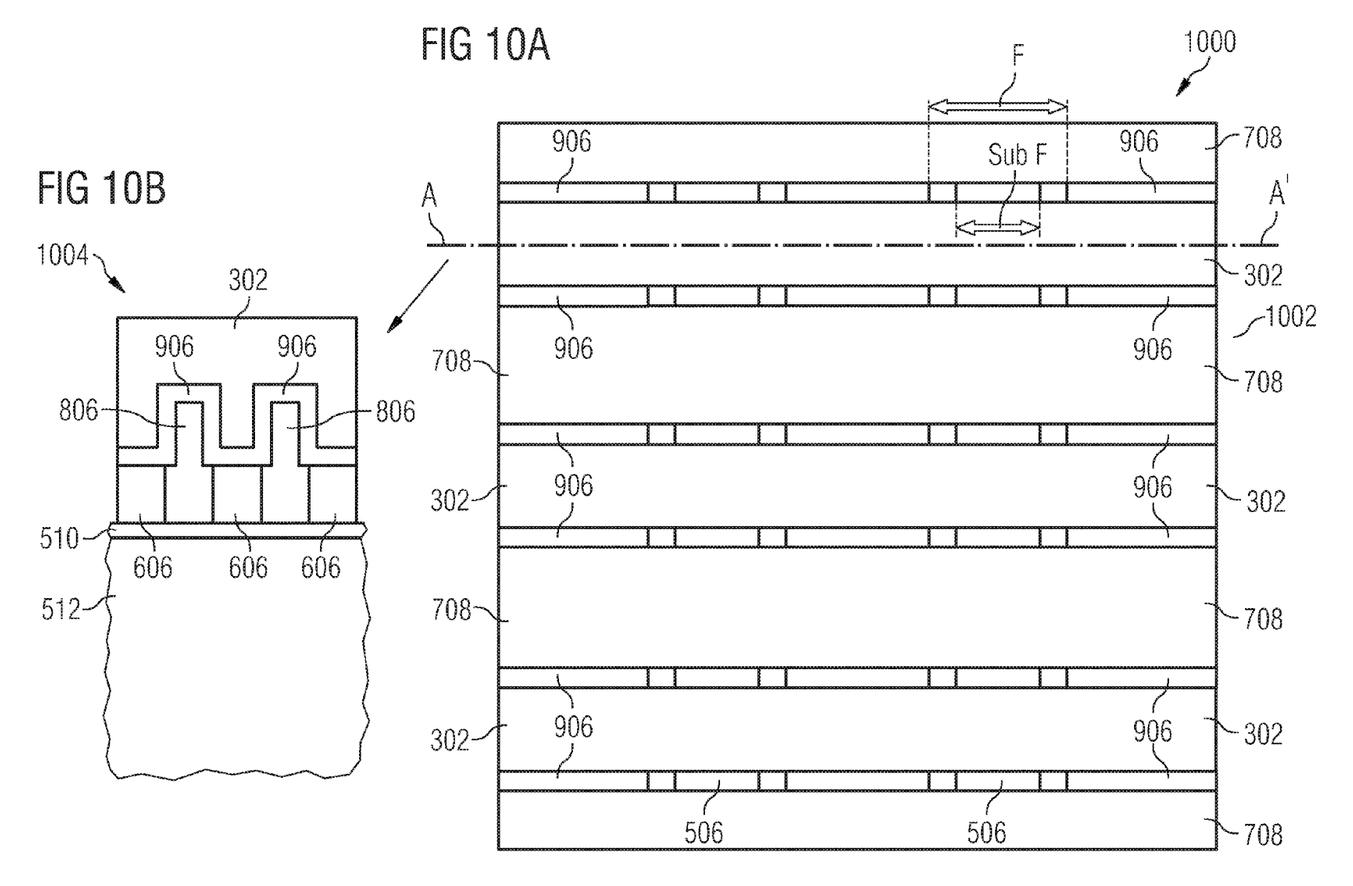
FIGS. 10A and 10B show a top view (FIG. 10A) and a cross sectional view (FIG. 10B) along a first section line A-A' of FIG. 10A of a cell arrangement in accordance with an embodiment of the invention at a sixth stage of its manufacture.

FIGS. 10A and 10B show a top view 1002 (FIG. 10A) and a cross sectional view 1004 (FIG. 10B) along a first section line A-A' of FIG. 10A of a cell arrangement 1000 in accordance with an embodiment of the invention at a sixth stage of its manufacture.

Then, the stripe-shape grooves between the stripe-shaped nitride portions 708 are filled and possibly overfilled with electrically conductive material such as, e.g., poly-silicon, a metal (e.g., a salicide, e.g., tungsten salicide (WSi) or titanium salicide (TiSi) or binary metal such has tantalum nitride (TaN), titanium nitride (TiN)) or any other suitable electrically conductive material. This process illustratively corresponds to a damascene process used for forming the word lines 302. The groove-overfilling electrically conductive material is then removed, e.g., by means of a CMP process with stop on the upper surface of the stripe-shaped nitride portions 708. In an embodiment of the invention, the damascene process is self-adjusted, since the electrically conductive material is filled in the stripe-shape grooves.

Figures 11A, 11B:
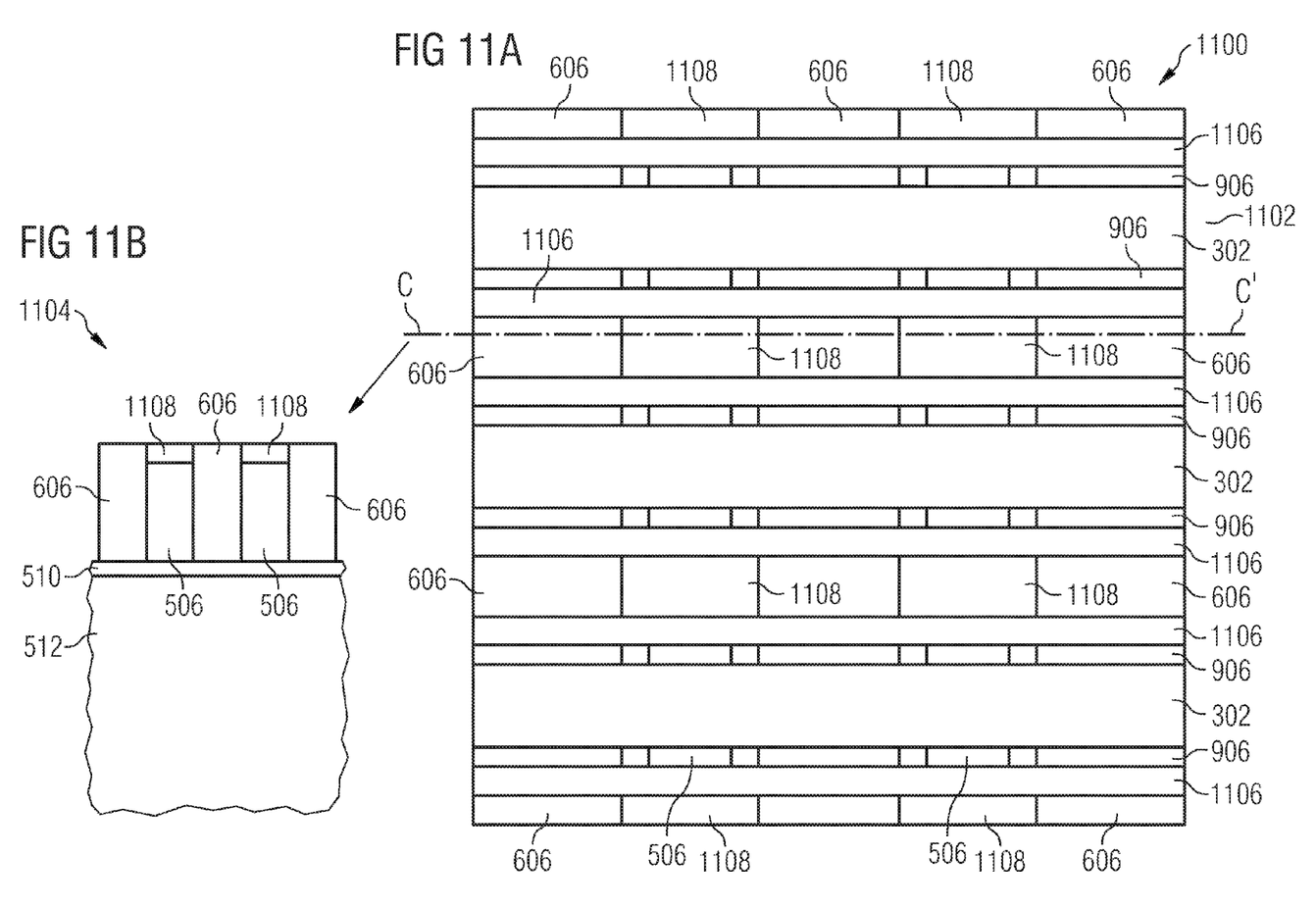
FIGS. 11A and 11B show a top view (FIG. 11A) and a cross sectional view (FIG. 11B) along a third section line C-C' of FIG. 11A of a cell arrangement in accordance with an embodiment of the invention at a seventh stage of its manufacture.

FIGS. 11A and 11B show a top view 1102 (FIG. 11A) and a cross sectional view 1104 (FIG. 11B) along a third section line C-C' of FIG. 11A of a cell arrangement 1100 in accordance with an embodiment of the invention at a seventh stage of its manufacture.

After having formed the word lines 302, the stripe-shaped nitride portions 708 are removed. By removing the stripe-shaped nitride portions 708, sidewalls of the word lines 302 and the charge storage regions 906 are exposed. Then, spacers 1106 are formed at the exposed sidewalls of the word lines 302 and the charge storage regions 906. In an embodiment of the invention, the spacers 1106 are made of an oxide, e.g., silicon oxide. In an embodiment of the invention, the spacers 1106 may be formed by first depositing the spacer material as a layer over the entire surface of the cell arrangement 1000 shown in FIGS. 10A and 10B, followed by a spacer etching process (e.g., an anisotropic etching process, e.g., a reactive ion etching process (RIE)), thereby exposing some portions of the fins 506, in which the source/drain regions of the field effect transistors should be formed.

Then, an ion implantation process (e.g., using boron ions (B ions) or using arsene ions (As ions)) is carried out, thereby implanting doping atoms in the exposed portions of the fins 506, thereby forming source/drain regions 1108 in the fins 506.

Then, the conventional processes for completing the cell arrangement, e.g., the memory cell arrangement, are executed, e.g., Back-End-Of-Line processes (BEOL) such as for example wiring, packaging, etc.

In an alternative embodiment of the invention, at least some portions of the charge storage layer stack 906 being deposited on the sidewalls of the fins 506 may be removed, e.g., my means of etching, e.g., by means of wet etching (which should be selective to the word lines) or by means of dry etching such as, e.g., reactive ion etching (RIE).

Figure 12A:
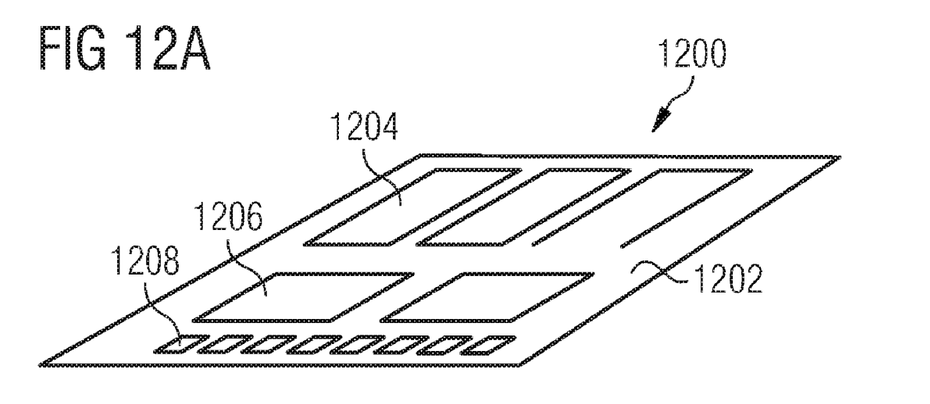
FIGS. 12A and 12B show a memory module (FIG. 12A) and a stackable memory module (FIG. 12B) in accordance with an embodiment of the invention.
Figure 12B:
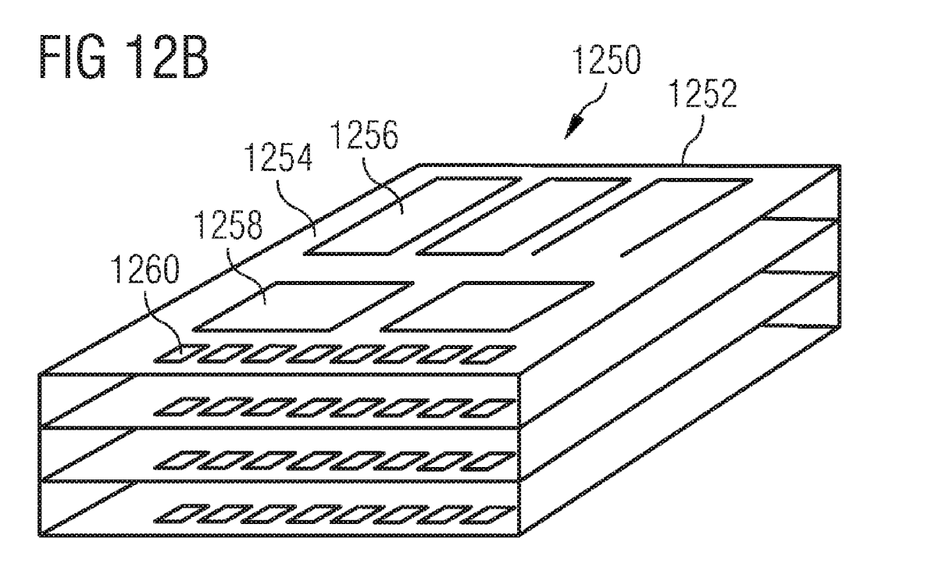

As shown in FIGS. 12A and 12B, in some embodiments, memory devices such as those described herein may be used in modules. In FIG. 12A, a memory module 1200 is shown, on which one or more memory devices 1204 are arranged on a substrate 1202. The memory device 1204 may include numerous memory cells, each of which uses a memory element in accordance with an embodiment of the invention. The memory module 1200 may also include one or more electronic devices 1206, which may include memory, processing circuitry, control circuitry, addressing circuitry, bus interconnection circuitry, or other circuitry or electronic devices that may be combined on a module with a memory device, such as the memory device 1204. Additionally, the memory module 1200 includes multiple electrical connections 1208, which may be used to connect the memory module 1200 to other electronic components, including other modules.

As shown in FIG. 12B, in some embodiments, these modules may be stackable, to form a stack 1250. For example, a stackable memory module 1252 may contain one or more memory devices 1256, arranged on a stackable substrate 1254. The memory device 1256 contains memory cells that employ memory elements in accordance with an embodiment of the invention. The stackable memory module 1252 may also include one or more electronic devices 1258, which may include memory, processing circuitry, control circuitry, addressing circuitry, bus interconnection circuitry, or other circuitry or electronic devices that may be combined on a module with a memory device, such as the memory device 1256. Electrical connections 1260 are used to connect the stackable memory module 1252 with other modules in the stack 1250, or with other electronic devices. Other modules in the stack 1250 may include additional stackable memory modules, similar to the stackable memory module 1252 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing an integrated circuit having a cell arrangement, the method comprising:
forming at least one semiconductor fin structure having an area for a plurality of fin field effect transistors, wherein the area of each fin field effect transistor comprises:
a first region having a first fin structure width;
a second region having a second fin structure width;
wherein the second fin structure width is smaller than the first fin structure width;
forming a plurality of charge storage regions on or above the second regions of the semiconductor fin structure; and
forming a plurality of source/drain regions in the first regions of the semiconductor fin structure.

2. The method of claim 1, further comprising forming a plurality of electrically conductive structures on or above the plurality of charge storage regions.

3. The method of claim 2, wherein the plurality of electrically conductive structures on or above the plurality of charge storage regions are formed using a damascene process.

4. The method of claim 1, wherein the plurality of charge storage regions are formed only on or above the second regions of the at least one semiconductor fin structure.

5. The method of claim 1, further comprising forming an additional semiconductor fin structure next to the semiconductor fin structure, wherein the semiconductor fin structure and the additional semiconductor fin structure extend substantially parallel to one another.

6. The method of claim 5, wherein forming the semiconductor fin structure and the additional semiconductor fin structure comprises:
forming a semiconductor fin and an additional semiconductor fin next to one another, wherein the semiconductor fin and the additional semiconductor fin extend substantially parallel to one another, wherein a hollow space is formed between the semiconductor fin and the additional semiconductor fin; and
forming filling material into the hollow space.

7. The method of claim 6, wherein the filling material comprises an oxide.

8. The method of claim 6, wherein forming the semiconductor fin structure and the additional semiconductor fin structure further comprises:
forming an insulating layer on an upper surface of the semiconductor fin and the additional semiconductor fin and the filling material; and
patterning the insulating layer such that the upper surface of the semiconductor fin and the additional semiconductor fin is exposed in the second regions.

9. The method of claim 8, wherein forming the semiconductor fin structure and the additional semiconductor fin structure further comprises:
decreasing a width of the insulating layer in a lithographic or etching or trimming or oxidation based manner.

10. The method of claim 8, wherein forming the semiconductor fin structure and the additional semiconductor fin structure further comprises:
thinning the semiconductor fin and the additional semiconductor fin in the second regions.

11. The method of claim 10, wherein thinning the semiconductor fin structure and the additional semiconductor fin structure is carried out selectively with regard to the insulating layer.

12. The method of claim 10 wherein thinning the semiconductor fin structure and the additional semiconductor fin structure is carried out by means of etching.

13. The method of claim 8, further comprising removing the insulating layer, thereby exposing sidewalls of the electrically conductive structures and a fin.

14. The method of claim 13, further comprising implanting dopant atoms in exposed portions of the semiconductor fin and the additional semiconductor fin, thereby forming source/drain regions in the semiconductor fin structure and the additional semiconductor fin structure.

15. The method of claim 13, further comprising forming insulating spacers on the exposed sidewalls of the electrically conductive structures.

16. The method of claim 1, wherein forming the plurality of charge storage regions on or above the second regions of the semiconductor fin structure comprises:
depositing a plurality of charge storage layer structures on or above the second regions of the semiconductor fin structure.

17. The method of claim 1, wherein forming the plurality of charge storage regions on or above the second regions of the semiconductor fin structure further comprises:
forming a plurality of floating gate layer structures on or above the second regions of the semiconductor fin structure.

18. The method of claim 1, wherein forming the plurality of charge storage regions on or above the second regions of the semiconductor fin structure further comprises:
forming a plurality of charge trapping layer structures on or above the second regions of the semiconductor fin structure.

* * * * *